United States Patent
Mignot et al.

(10) Patent No.: US 11,037,822 B2
(45) Date of Patent: Jun. 15, 2021

(54) SVIA USING A SINGLE DAMASCENE INTERCONNECT

(71) Applicant: INTERNATIONAL BUSINESS MACHINES CORPORATION, Armonk, NY (US)

(72) Inventors: Yann Mignot, Slingerlands, NY (US); Muthumanickam Sankarapandian, Niskayuna, NY (US); Yongan Xu, Niskayuna, NY (US); Joe Lee, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/406,447

(22) Filed: May 8, 2019

(65) Prior Publication Data

US 2020/0357692 A1  Nov. 12, 2020

(51) Int. Cl.
*H01L 21/768* (2006.01)
*H01L 23/522* (2006.01)
*H01L 21/311* (2006.01)
*H01L 21/321* (2006.01)

(52) U.S. Cl.
CPC .. *H01L 21/76877* (2013.01); *H01L 21/31116* (2013.01); *H01L 21/31144* (2013.01); *H01L 21/3212* (2013.01); *H01L 21/7684* (2013.01); *H01L 21/76816* (2013.01); *H01L 23/5226* (2013.01)

(58) Field of Classification Search
CPC ......... H01L 21/76877; H01L 21/31144; H01L 21/3212; H01L 21/31116; H01L 23/5226; H01L 21/76816; H01L 21/7684
See application file for complete search history.

(56) References Cited

U.S. PATENT DOCUMENTS

| | | | |
|---|---|---|---|
| 5,686,354 A | 11/1997 | Avanzino et al. | |
| 5,747,380 A | 5/1998 | Yu et al. | |
| 5,970,376 A | 10/1999 | Chen | |
| 6,284,642 B1 | 9/2001 | Liu et al. | |
| 6,323,121 B1 | 11/2001 | Lie et al. | |

(Continued)

FOREIGN PATENT DOCUMENTS

WO  2009079657 A2  6/2009

OTHER PUBLICATIONS

Khan, "Damascene Process and Chemical Mechanical Planarization", Oct. 2011, 4 pages.

*Primary Examiner* — Syed I Gheyas
(74) *Attorney, Agent, or Firm* — Tutunjian & Bitetto, P.C.; Abdy Raissinia (57) ABSTRACT

A method is presented for forming interlayer connections in a semiconductor device. The method includes patterning an etch stack to provide for a plurality of interlayer connections, etching guide layers following the etch stack to a first capping layer to form a plurality of guide openings, concurrently exposing a first plurality of conductive lines and a second plurality of conductive lines to form a plurality of interlayer connection openings by etching through the plurality of guide openings to remove the first capping layer, an interlayer dielectric, and a second capping layer, and depositing a metal fill in the plurality of interlayer connection openings to form the plurality of interlayer connections.

16 Claims, 9 Drawing Sheets

(56) References Cited

U.S. PATENT DOCUMENTS

| | | |
|---|---|---|
| 6,867,073 B1 | 3/2005 | Enquist |
| 8,035,143 B2 | 10/2011 | Jang |
| 8,114,769 B1* | 2/2012 | Srivastava ........ H01L 21/31144 |
| | | 257/E21.579 |
| 9,385,078 B1 | 7/2016 | Feurprier et al. |
| 9,505,972 B2 | 11/2016 | Iverson et al. |
| 9,653,303 B2 | 5/2017 | Ooshima |
| 9,805,972 B1 | 10/2017 | Zhang et al. |
| 9,805,977 B1 | 10/2017 | Sukumaran et al. |
| 10,020,254 B1 | 7/2018 | Bao et al. |
| 10,020,255 B1 | 7/2018 | Bao et al. |
| 10,026,687 B1 | 7/2018 | Lin et al. |
| 2007/0134917 A1 | 6/2007 | Li et al. |
| 2009/0140418 A1 | 6/2009 | Li et al. |
| 2012/0187546 A1 | 7/2012 | Akinmade-Yusuff et al. |
| 2015/0364420 A1 | 12/2015 | Lin et al. |
| 2016/0379929 A1* | 12/2016 | Feurprier .......... H01L 21/76808 |
| | | 257/774 |
| 2018/0102283 A1 | 4/2018 | Wu et al. |

* cited by examiner

| Pattern an etch stack to provide for a plurality of interlayer connections over a first plurality of conductive lines and a second plurality of conductive lines. |
| --- |
| 1510 |

| Etch guide layers following the etch stack to a first capping layer to form a plurality of guide openings. |
| --- |
| 1520 |

| Concurrently expose the first plurality of conductive lines and the second plurality of conductive lines to form a plurality of interlayer connection openings by etching through the plurality of guide openings to remove the first capping layer, an interlayer dielectric, and a second capping layer. |
| --- |
| 1530 |

| Deposit a metal fill in the plurality of interlayer connection openings to form a plurality of vias to the first plurality of conductive lines and a plurality of svias to the second plurality of conductive lines. |
| --- |
| 1540 |

| Planarize the metal fill down to the guide layers. |
| --- |
| 1550 |

| Remove the guide layers, form a dielectric layer and etch layers, pattern the etch layers to provide for a plurality of trenches, etch the plurality of trenches into the dielectric layer following the etch layer, and deposit a conductive material in the plurality of trenches. |
| --- |
| 1560 |

| One of the plurality of trenches forms a chamfer via. | One of the plurality of trenches forms an extended via. |
| --- | --- |
| 1565 | 1567 |

FIG. 15

SVIA USING A SINGLE DAMASCENE INTERCONNECT

BACKGROUND

The present invention generally relates to semiconductor devices and processing, and more particularly to devices with a super via or skip via (svia) and processing for svia using a single damascene interconnect.

Back end of line interconnects are created using a dual damascene scheme to define trenches and form vias. The dual damascene scheme can make via profile and chamfer heights a difficult parameter to meet. The via profiles and chamfer heights depend on the etch time if no stop layer is provided, causing the via line ends to be more "round" then square. Svias formed with the dual damascene scheme have blowouts in the dielectric layer. The blowouts in the dielectric occurs when the dielectric is removed faster than other materials during the etch, causing the via to balloon outwards beyond the etch pattern in the dielectric layer. These blowouts in the dielectric layer reduce the distance between the svias, which can cause shorting issues.

SUMMARY

In accordance with an embodiment of the present invention, a method forming interlayer connections in a semiconductor device is provided. The method includes patterning an etch stack to provide for a plurality of interlayer connections, etching guide layers following the etch stack to a first capping layer to form a plurality of guide openings, concurrently exposing a first plurality of conductive lines and a second plurality of conductive lines to form a plurality of interlayer connection openings by etching through the plurality of guide openings to remove the first capping layer, an interlayer dielectric, and a second capping layer, and depositing a metal fill in the plurality of interlayer connection openings to form the plurality of interlayer connections.

In accordance with another embodiment of the present invention, a method for forming interlayer connections in a semiconductor device is provided. The method includes patterning an etch stack to provide for a plurality of interlayer connections over a first plurality of conductive lines, a second plurality of conductive lines, etching guide layers following the etch stack to a first capping layer to form a plurality of guide openings, concurrently exposing the first plurality of conductive lines and the second plurality of conductive lines to form a plurality of interlayer connection openings by etching through the plurality of guide openings to remove the first capping layer, an interlayer dielectric, and a second capping layer, and depositing a metal fill in the plurality of interlayer connection openings to form a plurality of vias to the first plurality of conductive lines and a plurality of svias to the second plurality of conductive lines.

In accordance with yet another embodiment of the present invention, a semiconductor structure with interlayer connections is provided. The structure includes a first plurality of conductive lines disposed within an interlayer dielectric (ILD) covered by a first capping layer, a dielectric layer over the capping layer, a plurality of vias formed through the dielectric layer and the capping layer to the first plurality of conductive lines, a plurality of svias formed through the dielectric layer, the first capping layer, the ILD, and a second capping layer to a second plurality of conductive lines, with the plurality of svias having substantially vertical sidewalls, metal fill formed in the vias and svias, and a plurality trenches formed in the dielectric layer, with some of the plurality of trenches linking two or more the plurality of vias or the plurality of svias to form a chamfer via.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments in accordance with the present invention provide methods and devices for constructing vias and super vias or skip vias (svias) in semiconductor devices. The svias are vias that go through an inter-layer dielectric layer to reach conductive lines embedded or attached to the inter-layer dielectric layer.

Transistor scaling gets ever more complex with ever decreasing mode size. Performance benefits gained at the front-end-of-line (e.g., the transistors) can easily be undone if similar improvements are not made in the back-end-of-the-line (BEOL). BEOL processing involves the creation of stacked layers of metal wires that electrically interconnect transistors in a chip. With each technology node, this metal wiring scheme becomes more complex, mainly because there are more transistors to connect with an ever tighter pitch. Shrinking dimensions also means the wires have a reduced cross-sectional area, which drives up the resistance-capacitance product (RC) of the interconnect system. Making forming svias through inter-layer dielectrics in the semiconductor to the metal wiring paramount.

Metal-based single damascene processes can be utilized to form interconnects. The metal can be, e.g., copper (Cu). A simple single damascene flow can start with deposition of a low-k dielectric material on a structure. These low-k dielectric materials are designed to reduce the capacitance and the delay in the integrated circuits (ICs). In a next step, this low-k dielectric material can be covered with an oxide and a resist, with vias, svias, and trenches being formed using lithography and etch steps. These vias can connect one metal layer with a metal layer above or below. The svias can connect one metal layer to a layer beyond the layer above or below, bypassing or skipping the intervening layer. Then, a metallic barrier layer can be added to prevent metal atoms from migrating into the low-k dielectric materials. The barrier layers can be deposited with, e.g., physical vapor deposition (PVD), using materials such as, e.g., ruthenium, tantalum and tantalum nitride. In a next step, this structure can be seeded, electroplated with a metal (usually Cu), followed by a chemical mechanical planarization (CMP) step.

Embodiments in accordance with the present invention provide methods and devices for constructing vias, svias, and trenches with a single damascene process. The conductive lines can be, e.g., copper (Cu) lines. The vias and svias are formed with a single etch mask. Further processing can be performed to form trenches and expand the surface area of the vias and svias.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
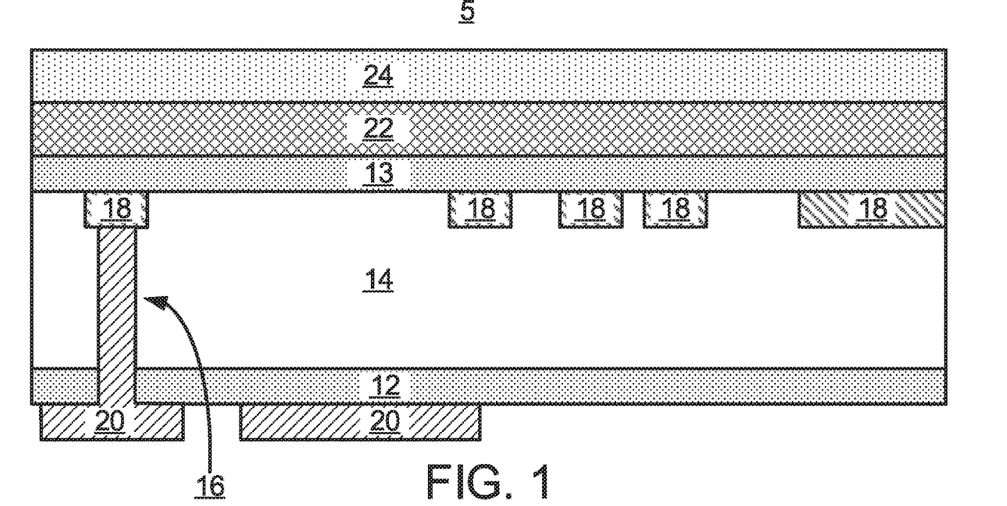
FIG. 1 is a cross-sectional view of a semiconductor structure including a stack and a plurality of conductive lines formed within a dielectric layer in accordance with an embodiment of the present invention.

Referring now to the drawings in which like numerals represent the same or similar elements and initially to FIG. 1, a cross-sectional view of a semiconductor structure including a stack and a plurality of conductive lines formed within a dielectric layer according to an embodiment of the present invention is illustratively shown.

A semiconductor structure 5 includes a plurality of conductive lines 18 formed within trenches of an inter-layer dielectric (ILD) 14. The ILD 14 can be formed over cap or capping layer 12, which can be formed over a substrate or conductive lines 20. The cap layer 12 can be continuous or have breaks to allow a conductive pillar 16 to link the conductive lines 18 and the conductive lines 20. The stack can be formed on the cap layer 13. The stack can include a first guide layer 22 and a second guide layer 24.

The cap layer 12 and the cap layer 13 can be deposited using a suitable deposition technique, such as, for example, chemical vapor deposition (CVD), plasma enhanced chemical vapor deposition (PECVD), radio frequency chemical vapor deposition (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating. The cap layer 12 and the cap layer 13 can include a dielectric material, such as, for example, a suitable nitride or carbide, e.g., aluminum nitride (AlN), silicon nitride (SiN), silicon carbide (SiC), silicon carbonitride (SiCN), hydrogenated silicon carbide (SiCH), or other suitable material. In a preferred embodiment, the cap layer 12 and the cap layer 13 can include an nBLoK™ layer, where nBLoK™ is a trademark of Applied Materials, Inc.). The cap layer 12 and the cap layer 13 can have a vertical thickness ranging from about 1 nm to about 30 nm. In one embodiment, the cap layer 12 and the cap layer 13 can have a vertical thickness ranging from about 5 nm to about 10 nm.

The ILD 14 can include any suitable materials, such as, for example, porous silicates, carbon doped oxides, silicon dioxides, silicon nitrides, silicon oxynitrides, or other dielectric materials. The ILD 14 can be formed using any method known in the art, such as, for example, chemical vapor deposition, plasma enhanced chemical vapor deposition, atomic layer deposition, or physical vapor deposition. The ILD 14 can have a thickness ranging from about 25 nm to about 200 nm.

The dielectric material of layer 14 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The conductive lines 18 can be formed in the openings or trenches formed in the ILD 14. The conductive lines 18 can be any suitable conductive materials, such as, for example, copper (Cu), aluminum (Al), ruthenium (Ru) or tungsten (W). The conductive lines 18 can be fabricated, by, for example, a single or dual damascene technique. In an embodiment, not illustrated, the conductive lines 18 and the conductive lines 20 can include copper (Cu) and can include a metal liner, where the metal liner can include suitable metals, such as, for example, tantalum nitride and tantalum (TaN/Ta), titanium, titanium nitride, cobalt, ruthenium, and manganese.

The first guide layer 22 can be deposited using a suitable deposition technique, such as, for example, CVD, PECVD, RFCVD, PVD, ALD, MBD, PLD, and/or LSMCD, sputtering, and/or plating. The first guide layer 22 can include a dielectric material. In one embodiment, the first guide layer 22 include titanium nitride (TiN). The first guide layer 22 can have a vertical thickness ranging from about 5 nm to about 75 nm. In one embodiment, the first guide layer 22 can have a vertical thickness ranging from about 10 nm to about 50 nm. The first guide layer 22 can be selectively etchable to the cap layer 13 and the second guide layer 24. Selectively etchable to means that a particular etchant which attacks one of the materials will not attack the other material as quickly, allowing for controlled removal of each material. In one embodiment, the vertical thickness of the first guide layer 22 combined with the vertical thickness of the cap layer 13 define the vertical thickness of vias formed on the conductive lines 18. In another embodiment, the vertical thickness of the first guide layer 22 defines the vertical thickness of vias formed on the conductive lines 18

The second guide layer 24 can be deposited using a suitable deposition technique, such as, for example, CVD, PECVD, RFCVD, PVD, ALD, MBD, PLD, and/or LSMCD, sputtering, and/or plating. The second guide layer 24 can include a dielectric material, such as, for example, silicon oxide (SiO), thin tetraethylorthosilicate (TEOS), or other suitable material. The second guide layer 24 can have a vertical thickness ranging from about 5 nm to about 75 nm. In one embodiment, the second guide layer 24 can have a vertical thickness ranging from about 10 nm to about 50 nm. The second guide layer 24 needs to be selectively etchable to the first guide layer 22.

Figure 2:
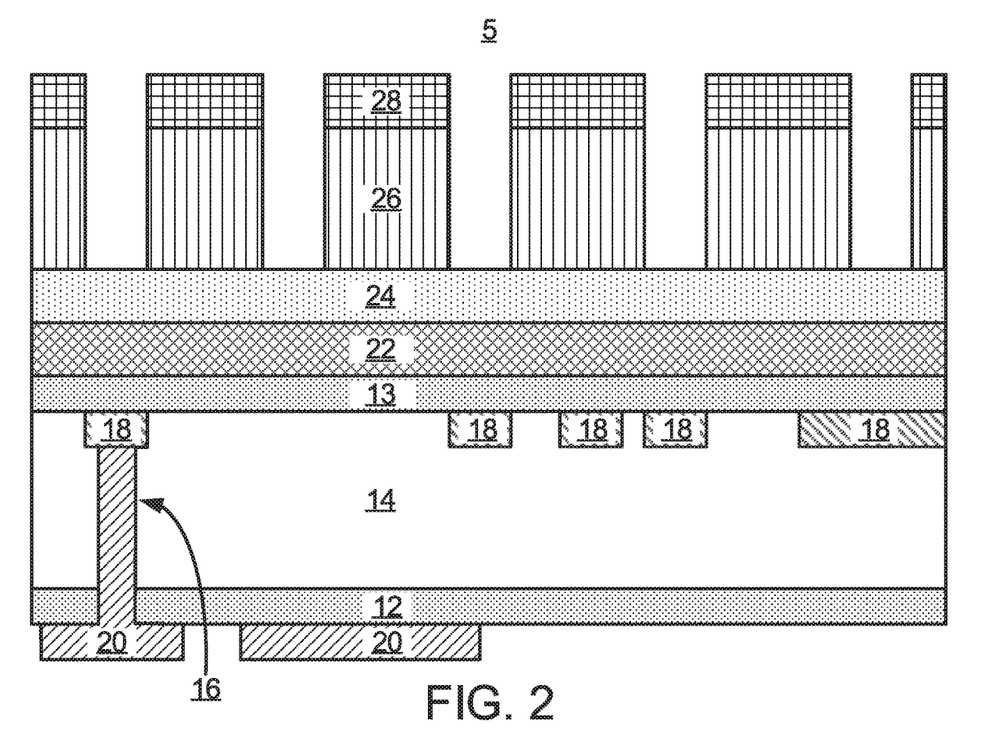
FIG. 2 is a cross-sectional view of the semiconductor structure of FIG. 1 where an etch mask is deposited and patterned in accordance with an embodiment of the present invention.

FIG. 2 is a cross-sectional view of the semiconductor structure of FIG. 1 where an etch mask is deposited and patterned, in accordance with an embodiment of the present invention.

The etch mask can include a sacrificial material 26 and a hard mask 28. The sacrificial material 26 can be deposited using a suitable deposition technique, such as, for example, Spin on, CVD, and/or, PVD. In one embodiment, the sacrificial material 26 can include an organic planarization layer (OPL). The sacrificial layer 26 can have a thickness ranging from about 25 nm to about 200 nm. The sacrificial layer 26 is selectively etchable to the hard mask 28 and the second guide layer 24.

The hard mask 28 can be deposited using a suitable deposition technique, such as, for example, spin on, CVD, PECVD, RFCVD, PVD, ALD, MBD, PLD, and/or LSMCD, sputtering, and/or plating. In one embodiment, the hard mask 28 can include a silicon containing anti-reflective coating (SiARC). The hard mask 28 can have a thickness ranging from about 10 nm to about 50 nm.

The etch mask is patterned for the locations of the vias and svias. The etch mask can be patterned using any suitable patterning process, such as, for example, Litho—Etch, Litho-Etch (LELE(LE)), and/or extreme ultraviolet (EUV).

Figure 3:
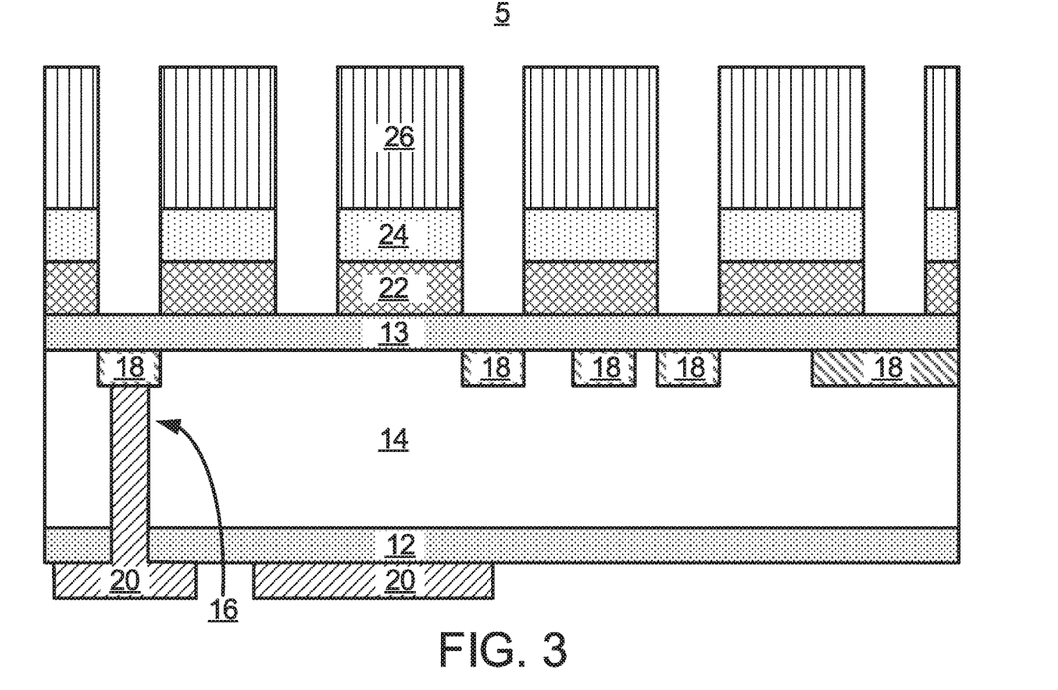
FIG. 3 is a cross-sectional view of the semiconductor structure of FIG. 2 where the stack is etched and part of the etch mask is removed in accordance with an embodiment of the present invention.

FIG. 3 is a cross-sectional view of the semiconductor structure of FIG. 2 where the stack is etched and part of the etch mask is removed, in accordance with an embodiment of the present invention.

The stack can be etched according to the etch mask to create openings in the stack for the vias and svias. The stack can be etched with any suitable etching technique, such as, for example, reactive ion etching (RIE). The hard mask 28 is partially etched or completely removed while etching the second guide layer 24

Figure 4:
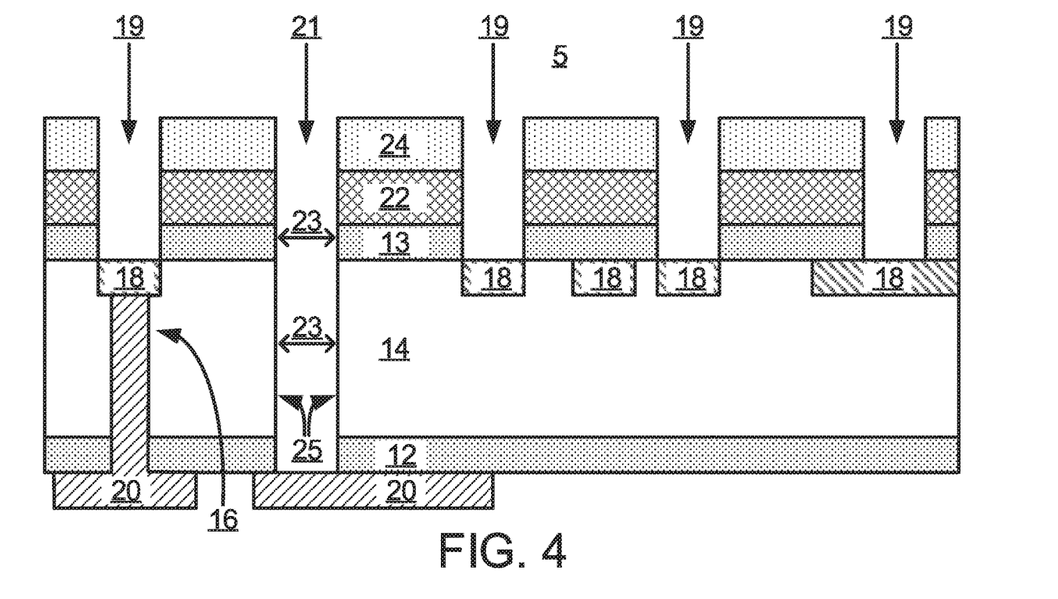
FIG. 4 is a cross-sectional view of the semiconductor structure of FIG. 3 where capping layers and dielectric material are etched to conductive lines and the remainder of the etch mask is removed in accordance with an embodiment of the present invention.

FIG. 4 is a cross-sectional view of the semiconductor structure of FIG. 3 where cap layers and dielectric material are etched to conductive lines and the remainder of the etch mask is removed, in accordance with an embodiment of the present invention.

The cap layer 13 can be etched according to the etch mask to create openings in the cap layer 13 for the vias and svias. The cap layer 13 can be etched with any suitable etching technique, such as, for example, reactive ion etching (RIE). Via openings 19 are created with the etching of the cap layer 13. The via openings will permit a metal fill to contact the conductive lines 18.

The ILD 14 is etched where exposed to form the svia openings 21. The ILD 14 can be etched with any suitable etching technique, such as, for example, reactive ion etching (RIE). The svia openings 21 will permit the metal fill to contact the conductive lines 20 through the ILD 14. The ILD 14 etching permits the svias formed to have a consistent width 23 throughout the svias, above the ILD 14 and in the ILD 14. The consistent width 23 keeps the svias from having blowouts in the ILD 14 below the capping layer 13. The svias include sidewalls 25 that are vertical, substantially vertical, or more than substantially vertical. Substantially vertical means that the surface is within 5° or less beyond vertical, e.g., 1%, 2%, 5%, etc. More than substantially vertical means that the surface is more than 5° beyond vertical, e.g., 10%, 15%, etc. In one embodiment, the sidewalls 25 of the svia vary by less than about 5° from vertical. In another embodiment, the sidewalls 25 of the svia vary by less than about 2° from vertical. In yet another embodiment, the sidewalls 25 of the svia are vertical.

The cap layer 12 can be etched according to the etch mask to create openings in the cap layer 12 for the svias. The cap layer 12 can be etched with any suitable etching technique, such as, for example, reactive ion etching (RIE). Via openings 21 are created with the etching of the cap layer 12. The via openings will permit a metal fill to contact the conductive lines 20.

The sacrificial material 26 is removed. The sacrificial material 26 can be removed with any suitable technique, such as, for example, OPL stripping.

Figure 5:
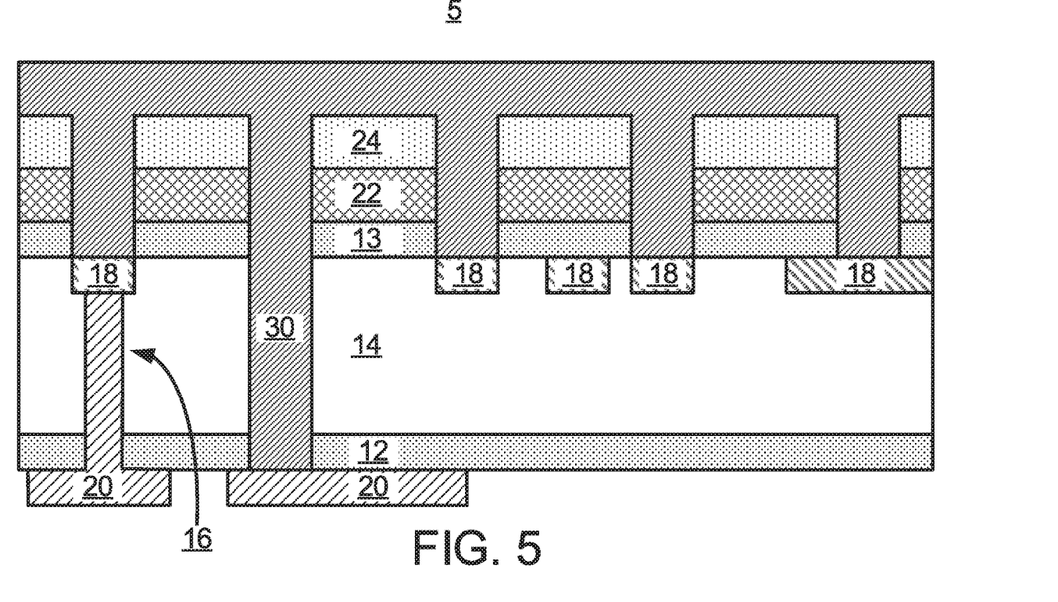
FIG. 5 is a cross-sectional view of the semiconductor structure of FIG. 4 where the semiconductor device is covered with a metal fill in accordance with an embodiment of the present invention.

FIG. 5 is a cross-sectional view of the semiconductor structure of FIG. 4 where the semiconductor device is covered with a metal fill, in accordance with an embodiment of the present invention.

The metal fill 30 can be deposited using a suitable deposition technique, such as, for example, CVD, PECVD, RFCVD, PVD, ALD, MBD, PLD, and/or LSMCD, sputtering, and/or plating. The metal fill 30 can include multiple layers or a single layer. The metal fill 30 can be any conductive materials known in the art, such as, for example, copper (Cu), aluminum (Al), ruthenium (Ru) or tungsten (W). In an embodiment, not illustrated, the metal fill 30 can be copper (Cu) and can include a metal liner (not shown), where the metal liner can be metals, such as, for example, tantalum nitride and tantalum (TaN/Ta), titanium, titanium nitride, cobalt, ruthenium, and manganese.

Figure 6:
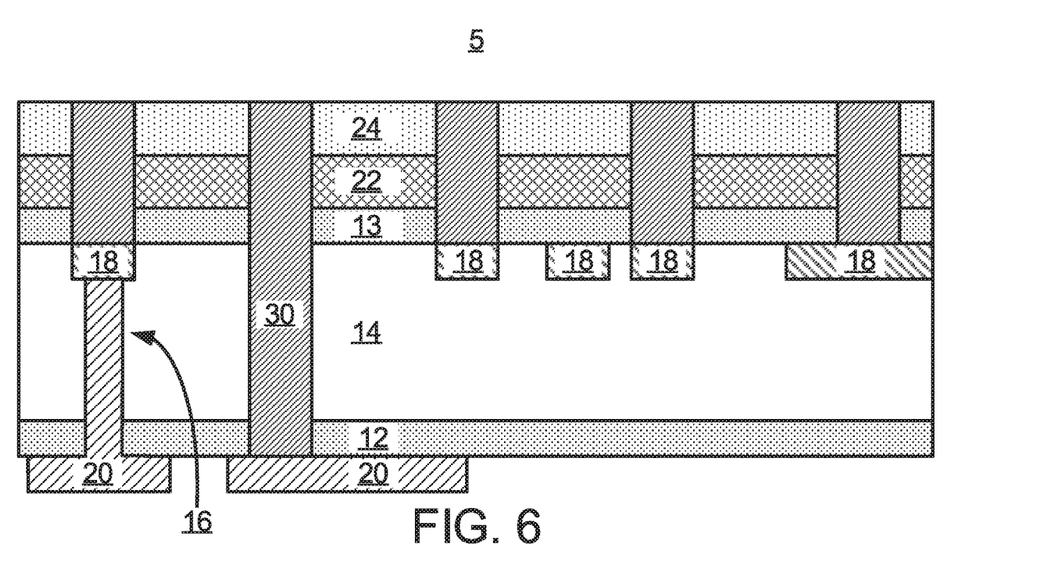
FIG. 6 is a cross-sectional view of the semiconductor structure of FIG. 5 where the metal fill is planarized down to the stack in accordance with an embodiment of the present invention.

FIG. 6 is a cross-sectional view of the semiconductor structure of FIG. 5 where the metal fill is planarized down to the stack, in accordance with an embodiment of the present invention.

The metal fill 30 can be planarized down the stack to form a planar surface. The metal fill 30 can be planarized with any suitable etching technique, such as, for example, chemical-mechanical planarization (CMP).

Figure 7:
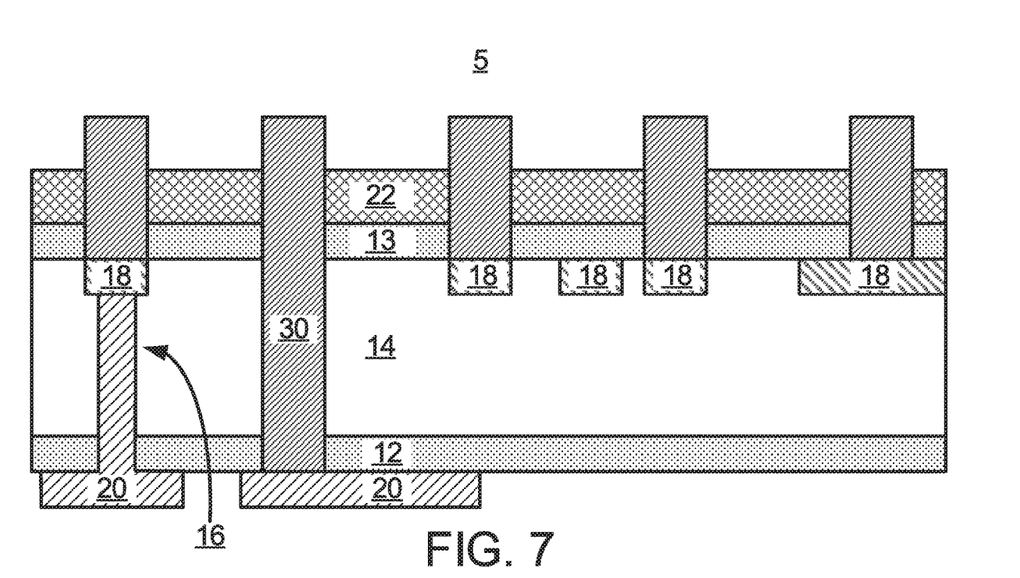
FIG. 7 is a cross-sectional view of the semiconductor structure of FIG. 6 where part of the stack is removed in accordance with an embodiment of the present invention.

FIG. 7 is a cross-sectional view of the semiconductor structure of FIG. 6 where part of the stack is removed, in accordance with an embodiment of the present invention.

The second guide layer 24 is removed. The second guide layer 24 can be removed with any suitable removal process, such as, for example, a wet etch process or a dry etch process. The removal of the second guide layer 24 exposes part of the metal fill 30 as vias or svias.

Figure 8:
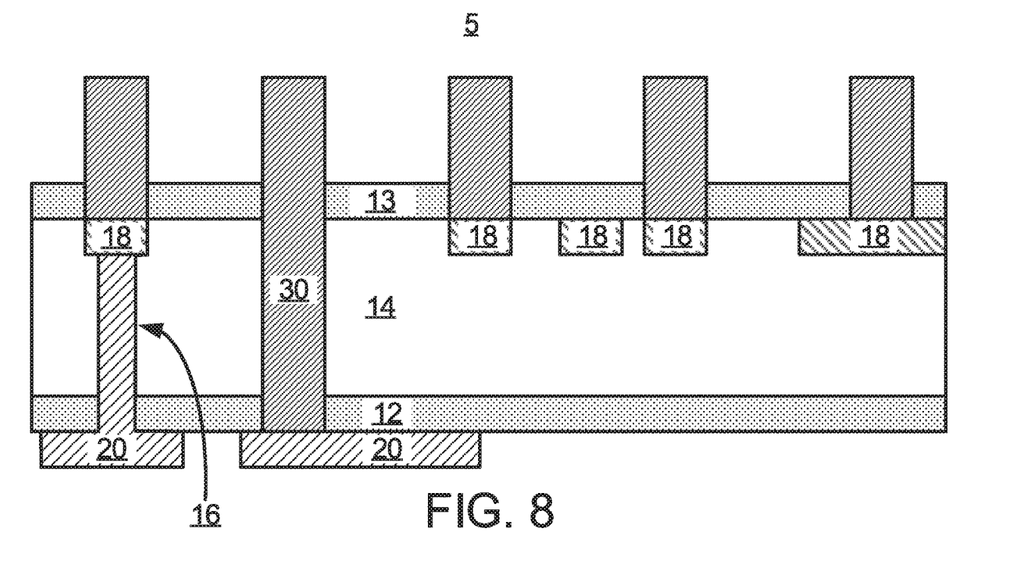
FIG. 8 is a cross-sectional view of the semiconductor structure of FIG. 7 where the remainder of the stack is removed in accordance with an embodiment of the present invention.

FIG. 8 is a cross-sectional view of the semiconductor structure of FIG. 7 where the remainder of the stack is removed, in accordance with an embodiment of the present invention.

The first guide layer 22 is removed. The first guide layer 22 can be removed with any suitable removal process, such as, for example, a wet etch process or a dry etch process. The removal of the first guide layer 22 exposes of the metal fill 30 as vias or svias.

Figure 9:
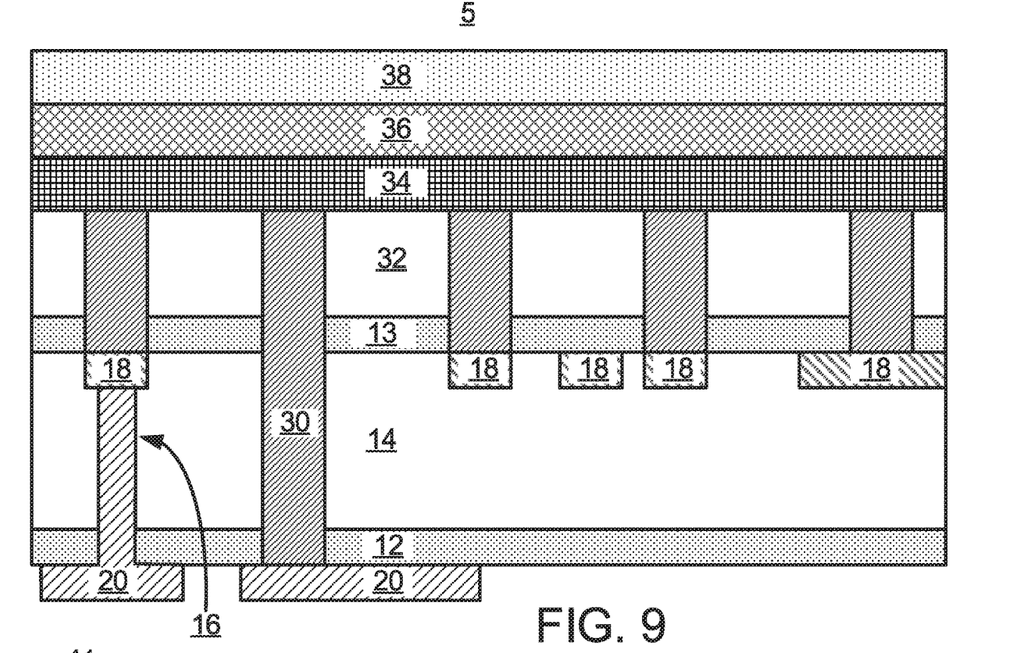
FIG. 9 is a cross-sectional view of the semiconductor structure of FIG. 8 where a dielectric material is formed and planarized and an etch mask is formed in accordance with an embodiment of the present invention.

FIG. 9 is a cross-sectional view of the semiconductor structure of FIG. 8 where a dielectric material is formed and planarized and an etch mask is formed, in accordance with an embodiment of the present invention.

The dielectric material 32 is formed. The dielectric material 32 can include any materials known in the art, such as, for example, porous silicates, carbon doped oxides, silicon dioxides, silicon nitrides, silicon oxynitrides, or other dielectric materials. The dielectric material 32 can be formed using any method known in the art, such as, for example, chemical vapor deposition, plasma enhanced chemical vapor deposition, atomic layer deposition, or physical vapor deposition. The dielectric material 32 can have a thickness ranging from about 10 nm to about 150 nm. In one embodiment, the dielectric material 32 can have a vertical thickness ranging from about 20 nm to about 100 nm.

The dielectric material 32 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The dielectric material 32 can be planarized down to the metal fill 30 to form a planar surface for the formation of the etch mask. The dielectric material 32 can be planarized with any suitable etching technique, such as, for example, chemical-mechanical planarization (CMP).

The etch mask can include multiple layers. In one embodiment, the etch mask can include a first etch layer 38, a second etch layer 36, and a third etch layer 34. In a preferred embodiment, the first etch layer 38 can include an oxide, the second etch layer 36 can include TiN, and the third etch layer 34 can include a nitride. The multiple layers of the etch mask can be selectively etchable to each other.

The first etch layer 38 can be deposited using a suitable deposition technique, such as, for example, CVD, PECVD, RFCVD, PVD, ALD, MBD, PLD, and/or LSMCD, sputtering, and/or plating. The first etch layer 38 can include a dielectric material, such as, for example, silicon oxide (SiO), thin tetraethylorthosilicate (TEOS), or other suitable material. The first etch layer 38 can have a vertical thickness ranging from about 5 nm to about 75 nm. In one embodiment, the first etch layer 38 can have a vertical thickness ranging from about 10 nm to about 50 nm. The first etch layer 38 can be selectively etchable to the second etch layer 36. In one embodiment, the vertical thickness of the first etch layer 38 an be the vertical thickness of metallization trenches formed further the process.

The second etch layer 36 can be deposited using a suitable deposition technique, such as, for example, CVD, PECVD, RFCVD, PVD, ALD, MBD, PLD, and/or LSMCD, sputtering, and/or plating. The second etch layer 36 can have a vertical thickness ranging from about 5 nm to about 75 nm. In one embodiment, the second etch layer 36 can have a vertical thickness ranging from about 10 nm to about 50 nm. The second etch layer 36 can be selectively etchable to the first etch layer 38 and the third etch layer 34.

The third etch layer 34 can be deposited using a suitable deposition technique, such as, for example, CVD, PECVD, RFCVD, PVD, ALD, MBD, PLD, and/or LSMCD, sputtering, and/or plating. The third etch layer 34 can include a dielectric material, such as, for example, silicon nitride (SiN), silicon carbide (SiC), silicon carbonitride (SiCN), hydrogenated silicon carbide (SiCH), or other suitable material. The third etch layer 34 can have a vertical thickness ranging from about 5 nm to about 75 nm. In one embodiment, the third etch layer 34 can have a vertical thickness ranging from about 10 nm to about 50 nm.

Figure 10:
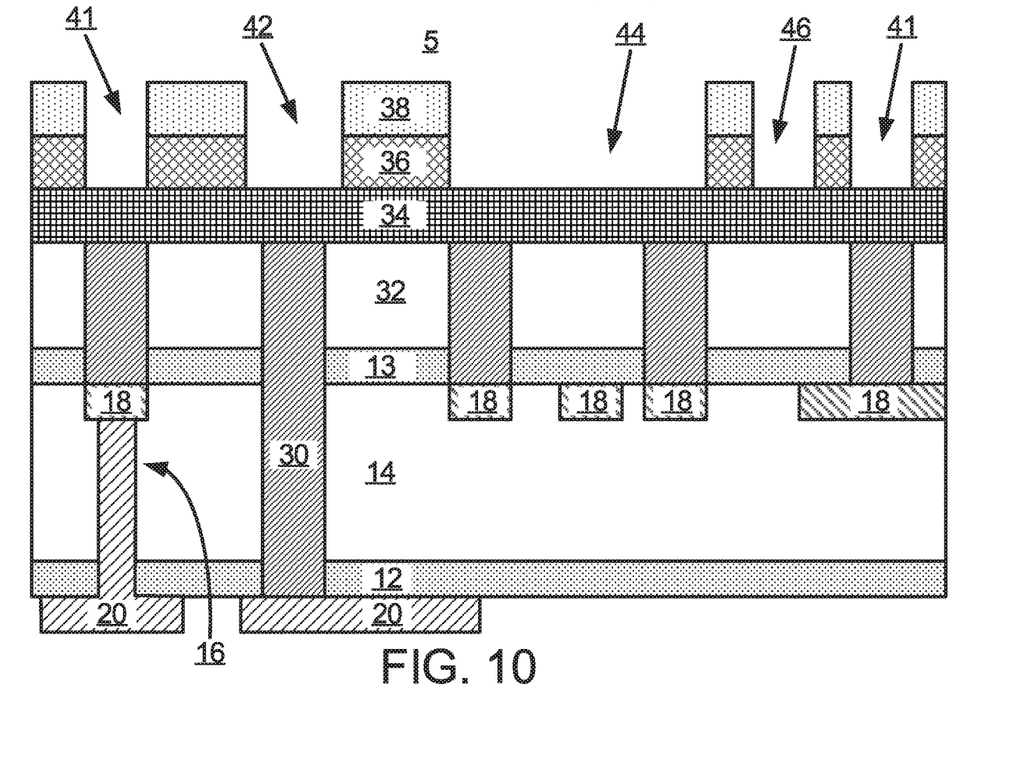
FIG. 10 is a cross-sectional view of the semiconductor structure of FIG. 9 where the etch mask is patterned in accordance with an embodiment of the present invention.

FIG. 10 is a cross-sectional view of the semiconductor structure of FIG. 9 where the etch mask is patterned, in accordance with an embodiment of the present invention.

The etch mask is patterned for a metallization process. The etch mask can be patterned using any suitable patterning process, such as, for example, Litho-Etch, Litho-Etch (LELE(LE)), self-aligned double patterning (SADP), extreme ultraviolet (EUV), self-aligned quadruple patterning (SAQP), reactive ion etch (RIE), or wet etch. The pattern formed in the etch mask can support several metalizations. Trench 41 can support a via or a svia without any extra metallization. This means that the trench 41 can be the same width as the via or svia. Trench 42 can support a via or a svia with extra metallization. This means that the trench 42 can be have a larger width than the via or svia giving the via and svia a larger surface area once processing in completed. Trench 44 can support linking a via or a svia to another via or svia forming a chamfer via. Trench 46 can form a trench metallization without contacting any via or svia.

Figure 11:
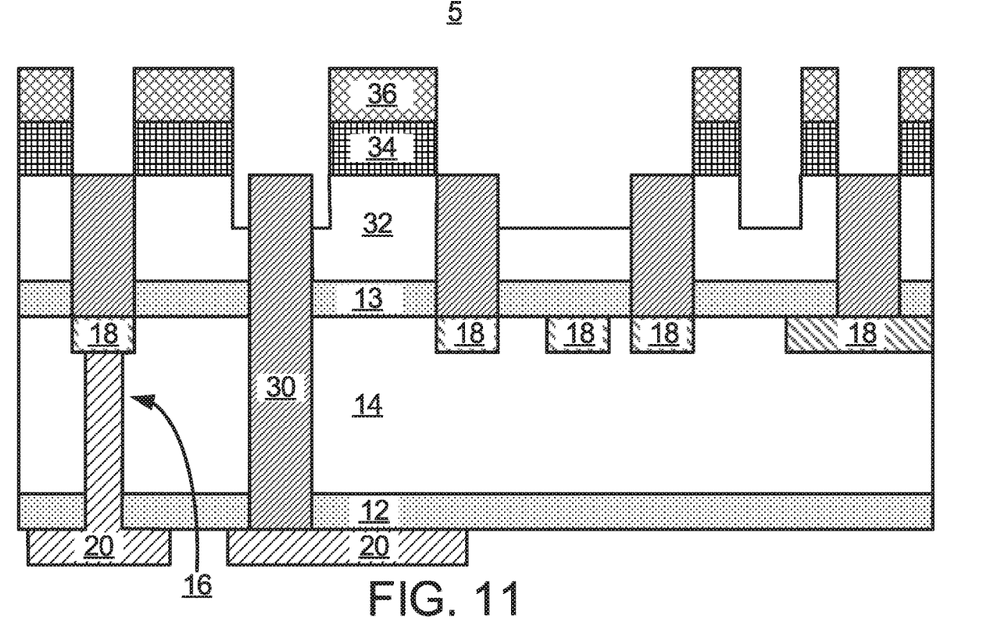
FIG. 11 is a cross-sectional view of the semiconductor structure of FIG. 10 where the dielectric material is etched employing the etch mask in accordance with an embodiment of the present invention.

FIG. 11 is a cross-sectional view of the semiconductor structure of FIG. 10 where the dielectric material is etched employing the etch mask, in accordance with an embodiment of the present invention.

The third etch layer 34 is etched with the etch mask pattern. The third etch layer 34 can be etched with any suitable etching technique, such as, for example, reactive ion etching (RIE).

The first etch layer 38 is removed and the dielectric material 32 is etched. The first etch layer 38 and the dielectric material 32 can be etched with any suitable etching technique, such as, for example, reactive ion etching (RIE). The trenches formed in the dielectric material 32 an be the basis for the metalizations further in the process.

Figure 12:
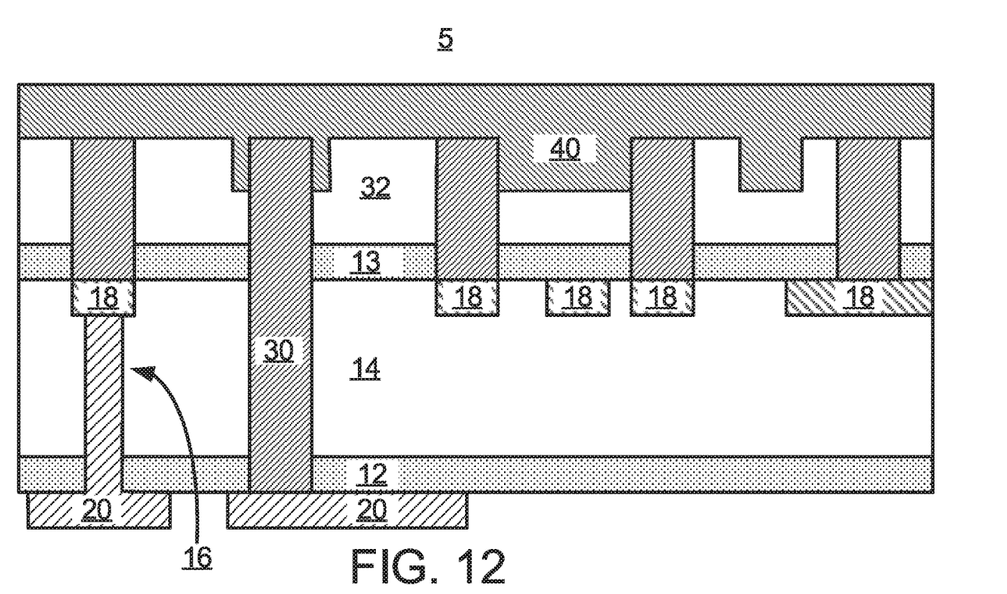
FIG. 12 is a cross-sectional view of the semiconductor structure of FIG. 11 where the etch mask is removed and a conductive layer is formed over the semiconductor device in accordance with an embodiment of the present invention.

FIG. 12 is a cross-sectional view of the semiconductor structure of FIG. 11 where the etch mask is removed and a conductive layer is formed over the semiconductor device, in accordance with an embodiment of the present invention.

The remainder of the etch mask is removed. Any suitable removal process can be employed to the remove the remainder of the etch mask. A single removal process can be employed, or multiple removal process can be employed. In one embodiment, the second etch layer 36 is removed with an RIE and the third etch layer 34 is removed with a second RIE. In another embodiment, the second etch layer 36 and the third etch layer 34 are removed with a wet process.

The conductive layer 40 can be deposited using a suitable deposition technique, such as, for example, CVD, PECVD, RFCVD, PVD, ALD, MBD, PLD, and/or LSMCD, sputtering, and/or plating. The conductive layer 40 can include multiple layers or a single layer. The conductive layer 40 can be any conductive materials known in the art, such as, for example, copper (Cu), aluminum (Al), ruthenium (Ru) or tungsten (W). In an embodiment, not illustrated, the conductive layer 40 can be copper (Cu) and can include a metal liner (not shown), where the metal liner can be metals, such as, for example, tantalum nitride and tantalum (TaN/Ta), titanium, titanium nitride, cobalt, ruthenium, and manganese. In one embodiment, the conductive layer 40 can be the same material as the metal fill 30. In another embodiment, the conductive layer 40 can be a different material as the metal fill 30.

Figure 13:
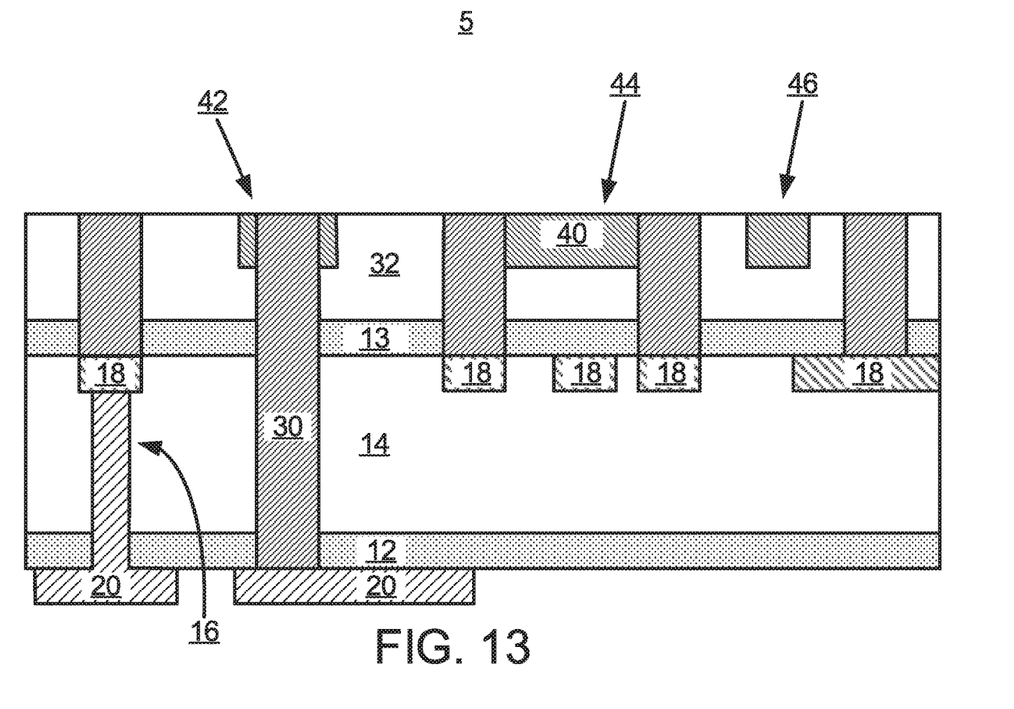
FIG. 13 is a cross-sectional view of the semiconductor structure of FIG. 12 where the conductive layer is planarized to the metal fill in accordance with an embodiment of the present invention.

FIG. 13 is a cross-sectional view of the semiconductor structure of FIG. 12 where the conductive layer is planarized to the metal fill, in accordance with an embodiment of the present invention.

The conductive layer 40 can be planarized down the metal fill 30 to form a planar surface. The conductive layer 40 can be planarized with any suitable etching technique, such as, for example, chemical-mechanical planarization (CMP). The planarization isolates the trench 42, the trench 44, and the trench 46 from each other. This creates the extended via in trench 42, the chamfer via in trench 44, and the metallization trench in trench 46.

Figure 14:
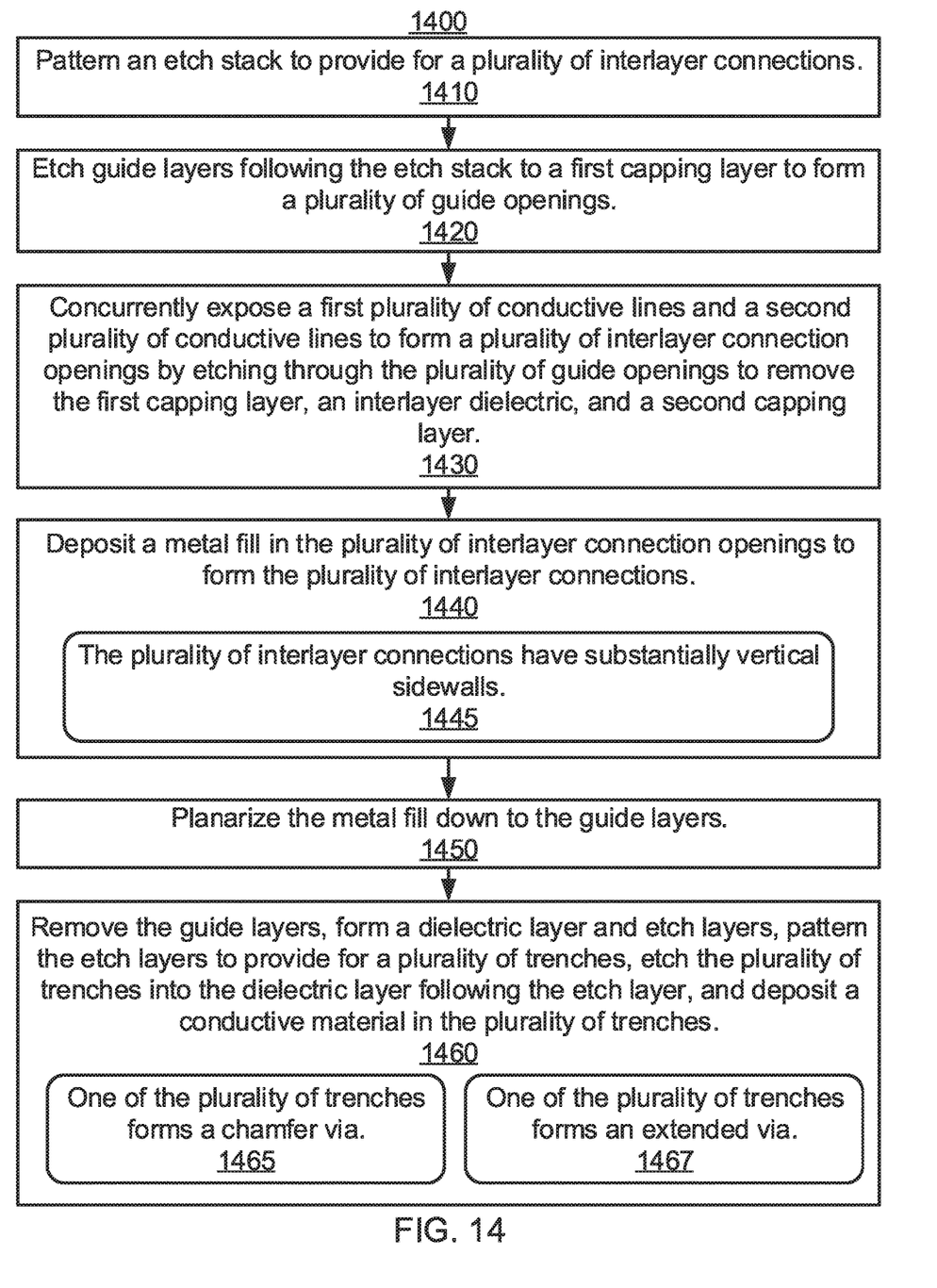
FIG. 14 is a block/flow diagram showing a method for forming a semiconductor device in accordance with embodiments of the present invention.

Referring to FIG. 14, methods for semiconductor processing are illustratively shown and described. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 1410, an etch stack are patterned to provide for a plurality of interlayer connections. In block 1420, guide layers are etched following the etch stack to a first capping layer to form a plurality of guide openings. In block 1430, a first plurality of conductive lines and a second plurality of conductive lines are concurrently exposed to form a plurality of interlayer connection openings by etching through the plurality of guide openings to remove the first capping layer, an interlayer dielectric, and a second capping layer. In block 1440, a metal fill is deposited in the plurality of interlayer connection openings to form the plurality of interlayer connections. In block 1445, the plurality of interlayer connections have substantially vertical sidewalls. In block 1450, the metal fill is planarized down to the guide layers. In block 1460, the guide layers are removed, a dielectric layer and etch layers are formed, the etch layers are patterned to provide for a plurality of trenches, the plurality of trenches are etched into the dielectric layer following the etch layer, and a conductive material is deposited in the plurality of trenches. In block 1465, one of the plurality of trenches forms a chamfer via. In block 1467, one of the plurality of trenches forms an extended via.

Figure 15:
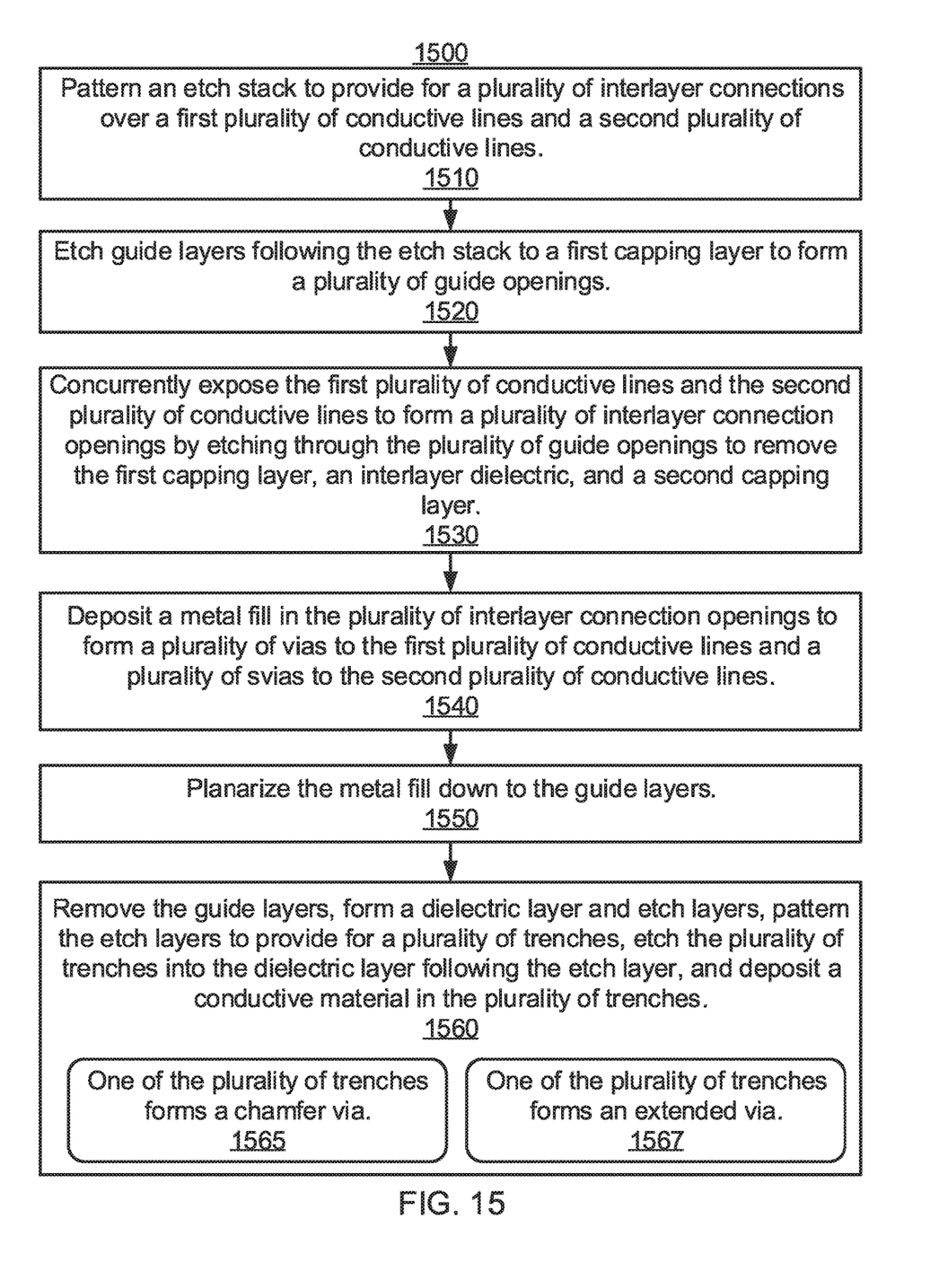
FIG. 15 is a block/flow diagram showing a method for forming a semiconductor device in accordance with embodiments of the present invention.

Referring to FIG. 15, methods for semiconductor processing are illustratively shown and described. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 1510, an etch stack is patterned to provide for a plurality of interlayer connections over a first plurality of conductive lines, a second plurality of conductive lines. In block 1520, guide layers are etched following the etch stack to a first capping layer to form a plurality of guide openings. In block 1530, the first plurality of conductive lines and the second plurality of conductive lines are exposed to form a plurality of interlayer connection openings by etching through the plurality of guide openings to remove the first capping layer, an interlayer dielectric, and a second capping layer. In block 1540, a metal fill is deposited in the plurality of interlayer connection openings to form a plurality of vias to the first plurality of conductive lines and a plurality of svias to the second plurality of conductive lines. In block 1550, the metal fill is planarized down to the guide layers. In block 1560, the guide layers are removed, a dielectric layer and etch layers are formed, the etch layers are patterned to provide for a plurality of trenches, the plurality of trenches are etched into the dielectric layer following the etch layer, and a conductive material is deposited in the plurality of trenches. In block 1455, one of the plurality of trenches forms a chamfer via. In block 1457, one of the plurality of trenches forms an extended via.

As used throughout the instant application, the term "copper" is intended to include substantially pure elemental copper, copper including unavoidable impurities including a native oxide, and copper alloys including one or more additional elements such as carbon, nitrogen, magnesium, aluminum, titanium, vanadium, chromium, manganese, nickel, zinc, germanium, strontium, zirconium, silver, indium, tin, tantalum, and platinum. In embodiments, the copper alloy is a copper-manganese alloy. In further embodiments, in lieu of copper, cobalt metal (Co) or cobalt metal alloys can be employed. The copper-containing structures are electrically conductive. "Electrically conductive" as used through the present disclosure refers to a material having a room temperature conductivity of at least $10^{-8}(\Omega\text{-m})^{-1}$.

Regarding FIGS. 1-13, deposition is any process that grows, coats, or otherwise transfers a material onto the wafer. Available technologies include, but are not limited to, thermal oxidation, spin-on, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming interlayer connections in a semiconductor device, the method comprising:
    patterning an etch stack to provide for a plurality of interlayer connections;
    etching guide layers following the etch stack to a first capping layer to form a plurality of guide openings for both via and svia locations;
    forming a plurality of interlayer connection openings with an etchant by etching through the plurality of guide openings, with the etchant exposing a first plurality of conductive lines at a first level by removing the first capping layer and the etchant exposing a second plurality of conductive lines at a second level by removing the first capping layer, an interlayer dielectric, and a second capping layer, where the second level is at least one metal layer from the first level; and
    depositing a metal fill in the plurality of interlayer connection openings to form the plurality of interlayer connections.

2. The method of claim 1, wherein depositing includes planarizing the metal fill down to the guide layers.

3. The method of claim 1, wherein the plurality of interlayer connections formed on the plurality of second conductive lines form skip vias that bypass the plurality of first conductive lines.

4. The method of claim 1, further comprising:
    removing the guide layers;
    forming a dielectric layer and etch layers;
    patterning the etch layers to provide for a plurality of trenches;
    etching the plurality of trenches into the dielectric layer following the etch layer; and
    depositing a conductive material in the plurality of trenches.

5. The method of claim 4, wherein one of the plurality of trenches forms a chamfer via by connecting two or more of the plurality of interlayer connections.

6. The method of claim 4, wherein one of the plurality of trenches forms an extended via by increasing a surface area of one of the plurality of interlayer connections.

7. The method of claim 1, wherein the plurality of interlayer connections have substantially vertical sidewalls.

8. A method for forming interlayer connections in a semiconductor device, the method comprising:
    patterning an etch stack to provide for a plurality of interlayer connections over a first plurality of conductive lines and a second plurality of conductive lines;
    etching guide layers following the etch stack to a first capping layer to form a plurality of guide openings for both via and svia locations;
    forming a plurality of interlayer connection openings with an etchant by etching through the plurality of guide openings, with the etchant exposing the first plurality of conductive lines at a first level by removing the first capping layer and the etchant exposing the second plurality of conductive lines at a second level by removing the first capping layer, an interlayer dielectric, and a second capping layer, where the second level is at least one metal layer from the first level; and
    depositing a metal fill in the plurality of interlayer connection openings to form a plurality of vias to the first plurality of conductive lines at the first level and a plurality of svias to the second plurality of conductive lines at the second level.

9. The method of claim 8, wherein depositing includes planarizing the metal fill down to the guide layers.

10. The method of claim 8, further comprising:
    removing the guide layers;
    forming a dielectric layer and etch layers;
    patterning an etch layer to provide for a plurality of trenches;
    etching the plurality of trenches into the dielectric layer following the etch layer; and
    depositing a conductive material in the plurality of trenches.

11. The method of claim 10, wherein one of the plurality of trenches forms a chamfer via by connecting at least one via and at least one svia.

12. The method of claim 10, wherein one of the plurality of trenches forms an extended via by increasing a surface area of one of the plurality of vias or one of the plurality of svias.

13. The method of claim 8, wherein the plurality of svias have substantially vertical sidewalls.

14. A semiconductor structure with interlayer connections, the semiconductor structure comprising:
    a first plurality of conductive lines disposed within an interlayer dielectric (ILD) covered by a first capping layer;
    a dielectric layer over the capping layer;
    a plurality of vias formed through the dielectric layer and the capping layer to the first plurality of conductive lines at a first level;
    a plurality of svias formed through the dielectric layer, the first capping layer, the ILD, and a second capping layer to a second plurality of conductive lines at a second level where the second level is at least one metal layer away from the first level, with the plurality of svias having substantially vertical sidewalls;
    metal fill formed in the vias and svias; and
    a plurality of trenches formed in the dielectric layer, with some of the plurality of trenches linking two or more of the plurality of vias and the plurality of svias to form a chamfer via, wherein the chamfer via includes at least one via portion connected to one of the first plurality of conductive lines at the first level and at least one svia portion connected to one of the second plurality of conductive lines at the second level, and with some of the plurality of trenches expanding the plurality of the vias to form expanded vias.

15. The semiconductor structure of claim 14, wherein some of the plurality of trenches have no contact with the plurality of vias or the plurality of svias.

16. The semiconductor structure of claim 14, wherein some of the plurality of trenches expand the plurality of svias to form expanded svias.

* * * * *